United States Patent
Ogawa

(10) Patent No.: US 9,741,911 B2
(45) Date of Patent: Aug. 22, 2017

(54) CURABLE RESIN COMPOSITION, OPTICAL ELEMENT AND OPTICAL SEMICONDUCTOR DEVICE

(71) Applicant: HOYA CANDEO OPTRONICS CORPORATION, Toda-shi, Saitama (JP)

(72) Inventor: Shinichi Ogawa, Toda (JP)

(73) Assignee: HOYA CANDEO OPTRONICS CORPORATION, Toda-Shi, Saitama (JP)

( * ) Notice: Subject to any disclaimer, the term of this patent is extended or adjusted under 35 U.S.C. 154(b) by 0 days.

(21) Appl. No.: 15/183,247

(22) Filed: Jun. 15, 2016

(65) Prior Publication Data

US 2016/0372640 A1    Dec. 22, 2016

(30) Foreign Application Priority Data

Jun. 16, 2015  (JP) .................................. 2015-121293
May 2, 2016   (JP) .................................. 2016-092360

(51) Int. Cl.
| | | |
|---|---|---|
| C09D 183/04 | (2006.01) | |
| H01L 33/56 | (2010.01) | |
| H01L 33/32 | (2010.01) | |

(52) U.S. Cl.
CPC ............ *H01L 33/56* (2013.01); *C09D 183/04* (2013.01); *H01L 33/32* (2013.01); *H01L 2224/48091* (2013.01); *H01L 2224/49107* (2013.01); *H01L 2924/181* (2013.01); *H01L 2933/005* (2013.01)

(58) Field of Classification Search
CPC ................ C09D 183/04; G01T 1/2928; H01L 2933/0033; H01L 2933/005; H01L 33/56
See application file for complete search history.

(56) References Cited

U.S. PATENT DOCUMENTS

2012/0168781 A1*  7/2012  Chun ....................... H01B 1/22
                                                              257/88
2016/0340474 A1* 11/2016  Yoshikawa ............. C08L 83/04

FOREIGN PATENT DOCUMENTS

| JP | 2003-176334 A | 6/2003 |
|---|---|---|
| JP | 2003-277473 A | 10/2003 |
| JP | 2010-059359 A | 3/2010 |

* cited by examiner

*Primary Examiner* — Marcos D Pizarro
*Assistant Examiner* — Benjamin Tzu-Hung Liu
(74) *Attorney, Agent, or Firm* — Rabin & Berdo, P.C.

(57) ABSTRACT

Disclosed is a curable resin composition that has significantly high transparency in the UV region, UV resistance and heat resistance, does not cause cracking, peeling or coloration even when used for sealing a UV LED to which high power is applied, and inhibits shrinking during curing. The curable resin composition includes 20-85 wt % of an alkoxy oligomer having a specific structure and present as liquid at room temperature and 15-80 wt % of a silicone resin present as solid at room temperature. The curable resin composition preferably includes 0.1-20 parts by weight of phosphoric acid, as a catalyst, based on 100 parts by weight of the combined weight of the alkoxy oligomer and the silicone resin.

12 Claims, 3 Drawing Sheets

CURABLE RESIN COMPOSITION, OPTICAL ELEMENT AND OPTICAL SEMICONDUCTOR DEVICE

TECHNICAL FIELD

The present disclosure relates to a curable resin composition having high light transmission in a wavelength region of ultraviolet (UV) rays, high UV resistance and high heat resistance, and an optical element and optical semiconductor device (such as UV light emitting diode (LED)) using the curable resin composition.

BACKGROUND ART

Recently, a light emitting diode (LED) that emits the light with a short wavelength, including a blue LED or UV LED, has been developed and commercialized. The use of such an LED has been extended rapidly, and particular examples of the use include general lighting in which the conventional fluorescent lamps or light bulbs are used and light sources in which the conventional short arc lamps are used for curing UV curable resins or UV curable ink.

In general, an LED has an LED die including an anode and cathode formed on the surface thereof. Each of the anode and cathode is wire bonded to the external electrode and the LED die electrically communicates with the external electrode to carry out light emission.

In the LED having the above-mentioned constitution, when the LED die and fine wires (e.g. diameter: 30 μm) are exposed to the external space, the LED die may be damaged or the wires may undergo a short. Thus, the LED is used generally after it is sealed with a sealant (such as a resin).

In addition, When the LED is sealed with a sealant having a refraction index higher than the refraction index of air, the difference in refraction index at the interface between the LED die and sealant is decreased. Therefore, sealing the LED with a sealant is also effective for improving the light ejection efficiency.

In the case of the conventional LED emitting the visible light, a highly transparent epoxy resin, silicone resin, etc. have been used as a sealant (see, Patent Documents 1 and 2). However, when using the conventional epoxy resin or silicone resin is applied to an LED emitting the light with a short wavelength, the resin itself may be degraded due to the short-wavelength light, thereby causing some problems, such as coloration of cracking. In addition, such problems of a sealant become serious particularly in the case of a UV LED used as a light source emitting strong UV rays for curing a UV curable resin or UV curable ink.

For example, the UV LED used as a light source for curing a UV curable resin or UV curable ink includes an LED emitting 1 W of UV light having a wavelength of 365 nm through the supply of an electric power of 3 W to an LED die having a width×length of 1 mm×1 mm. In this case, the light irradiation dose becomes 1 W/mm$^2$, which corresponds to 30,000-50,000 times of the UV light dose included in the solar light. Due to this, it is required for a sealant for an UV LED as a light source for curing a UV curable resin or UV curable ink to have resistance against strong UV rays in addition to high transparency in a wavelength region of light emission for the UV LED.

In addition, since 2 W of the electric power of 3 W inputted to the UV LED is converted into thermal energy so that the LED die itself may be heated, it is required for the sealant for an UV LED as a light source for curing a UV curable resin or UV curable ink to have resistance against heat (temperature) in addition to UV ray resistance.

Further, it has been suggested that a composition including an epoxy group-containing multifunctional polysiloxane and a metal chelate compound is used as a sealant for an LED or the like (Patent Document 3).

REFERENCES

Patent Documents

Japanese Patent Laid-Open No. 2003-176334
Japanese Patent Laid-Open No. 2003-277473
Japanese Patent Laid-Open No. 2010-059359

DISCLOSURE

Technical Problem

The composition disclosed in Patent Document 3 is cured by epoxy ring opening. Since the structure of the cured product includes a metal chelate compound having high absorptivity in the UV region, it shows insufficient transparency in the UV region, UV resistance and heat resistance, when used for sealing a UV LED to which high power is applied.

In addition, the UV LED has an optical element, such as a lens, in addition to a light emitting portion (i.e., UV LED). Thus, it is also required for such an optical element to have high transparency in the UV region and sufficiently high UV resistance and heat resistance.

Under these circumstances, a technical problem to be solved by the present disclosure is to provide a curable resin composition that has significantly higher transparency in the UV region, UV resistance and heat resistance as compared to the conventional curable resin compositions, does not cause cracking, peeling or coloration even when used as sealant for a UV LED to which high power is applied or as a material for an optical element, and is capable of inhibiting shrinking during curing. Another technical problem to be solved by the present disclosure is to provide an optical element and optical semiconductor device including the cured product of the curable resin composition.

Technical Solution

To solve the above-mentioned problems, the inventors of the present disclosure have conducted intensive studies about a raw material for a curable resin composition suitable for sealing a UV LED to which high power is applied in view of transparency, UV resistance, heat resistance and moldability. As a result, we have found that it is possible to obtain an optimized curable resin composition by using a high-solid content alkoxy oligomer having a non-reactive functional group in order to impart stress-relieving ability in combination with a silicone resin as a material for further increasing solid content. The present disclosure is based on this finding.

According to the present disclosure, there are provided:

(i) a curable resin composition including 20-85 wt % of an alkoxy oligomer present as liquid at room temperature and 15-80 wt % of a silicone resin present as solid at room temperature, wherein the alkoxy oligomer has an organopolysiloxane structure including at least one structural unit selected from the structural unit represented by Formula 1, structural unit represented by Formula 2, structural unit represented by Formula 3 and the structural unit represented by Formula 4, in combination with at least one structural unit selected from the structural unit represented by Formula 5, structural unit represented by Formula 6 and the structural unit represented by Formula 7, and 90-100 mol % of the structural units represented by Formula 1-Formula 7 are present based on 100 mol % of the total siloxane units forming the alkoxy oligomer:

[Formula 1]

$$(R^1R^2R^3SiO_{1/2}) \quad (1)$$

(wherein each of $R^1$, $R^2$ and $R^3$ independently represents the same or a different organic group)

[Formula 2]

$$(R^4R^5SiO_{2/2}) \quad (2)$$

(wherein each of $R^4$ and $R^5$ independently represents the same or a different organic group).

[Formula 3]

$$(R^6SiO_{3/2}) \quad (3)$$

(wherein $R^6$ is an organic group)

[Formula 4]

$$(SiO_{4/2}) \quad (4)$$

[Formula 5]

$$(R^7_a(OR^8)_{3-a}SiO_{1/2}) \quad (5)$$

(wherein a is 0, 1 or 2, each of $R^7$ and $R^8$ independently represents the same or a different organic group, and when two or more $R^7$s or $R^8$s are present, each $R^7$ or $R^8$ may be the same or different)

[Formula 6]

$$(R^9_b(OR^{10})_{2-b}SiO_{2/2}) \quad (6)$$

(wherein b is 0 or 1, each of $R^9$ and $R^{10}$ independently represents the same or a different organic group, and when two or more $R^{10}$s are present, each $R^{10}$ may be the same or different)

[Formula 7]

$$((OR^{11})SiO_{3/2}) \quad (7)$$

(wherein $R^{11}$ is an organic group);

(ii) the curable resin composition as defined in (i), which includes 0.1-20 parts by weight of phosphoric acid as a curing catalyst based on 100 parts by weight of the combined weight of the alkoxy oligomer and silicone resin;

(iii) the curable resin composition as defined in (i) or (ii), wherein the alkoxy oligomer includes alkoxy groups in an amount of 10-30 wt %;

(iv) the curable resin composition as defined in any one of (i) to (iii), wherein the solidified product obtained by curing the curable resin composition has a shrinkage of 10 wt % or less during curing;

(v) the curable resin composition as defined in any one of (i) to (iv), wherein the solidified product obtained by curing the curable resin composition shows a UV transmission of 85% or more, when UV light is irradiated to the solidified product at a luminous intensity of 100 W/cm² for 500 hours;

(vi) the curable resin composition as defined in any one of (i) to (iv), wherein the solidified product obtained by curing the curable resin composition shows a UV transmission of 85% or more, when UV light is irradiated to the solidified product at a luminous intensity of 100 W/cm² for 1000 hours;

(vii) the curable resin composition as defined in any one of (i) to (iv), wherein the solidified product obtained by curing the curable resin composition shows a UV transmission of 80% or more, when UV light is irradiated to the solidified product at a luminous intensity of 100 W/cm² for 5000 hours;

(viii) the curable resin composition as defined in any one of (i) to (vii), wherein the UV light has a light emission peak wavelength of 365 nm;

(ix) an optical element including the cured product of the curable resin composition as defined in any one of (i) to (viii);

(x) an optical semiconductor device having an optical semiconductor element sealed with the curable resin composition as defined in any one of (i) to (viii);

(xi) an optical semiconductor device having the optical element as defined in (ix); and (xii) the optical semiconductor device as defined in (x), wherein the optical semiconductor element emits light in the UV region.

Advantageous Effects

According to the embodiments of the present disclosure, it is possible to provide a curable resin composition that has significantly higher transparency in the UV region, UV resistance and heat resistance as compared to the conventional curable resin compositions, does not cause cracking, peeling or coloration even when used as sealant for a UV LED to which high power is applied or as material for an optical element, and is capable of inhibiting shrinking during curing. It is also possible to provide an optical element and optical semiconductor device including the cured product of the curable resin composition.

BEST MODE

Figure 1:
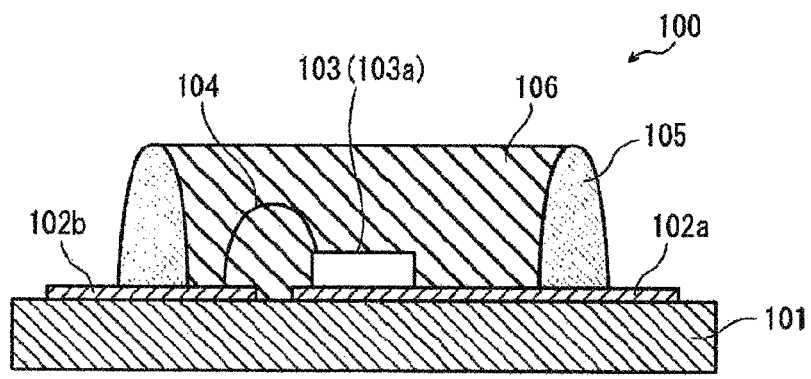
FIG. 1 is a schematic view illustrating a surface mount type UV LED to which the curable resin composition according to an embodiment is applied.

Exemplary embodiments now will be described more fully hereinafter.

This disclosure may, however, be embodied in many different forms and should not be construed as limited to the exemplary embodiments set forth therein.

For example, the curable resin composition according to an embodiment is used as a sealant for a UV LED to which high power is applied or as a material for an optical element, and includes an alkoxy oligomer and a silicone resin.

[Alkoxy Oligomer]

In the curable resin composition according to an embodiment, the alkoxy oligomer has an organopolysiloxane structure, and has at least one structural unit selected from the structural unit represented by Formula 1, structural unit represented by Formula 2, structural unit represented by Formula 3 and the structural unit represented by Formula 4, in combination with at least one structural unit selected from the structural unit represented by Formula 5, structural unit represented by Formula 6 and the structural unit represented by Formula 7, wherein 90-100 mol % of the structural units represented by Formula 1-Formula 7 are present based on 100 mol % of the total siloxane units forming the alkoxy oligomer:

[Formula 1]

$$(R^1R^2R^3SiO_{1/2}) \quad (1)$$

(wherein each of $R^1$, $R^2$ and $R^3$ independently represents the same or a different organic group)

[Formula 2]

$$(R^4R^5SiO_{2/2}) \quad (2)$$

(wherein each of $R^4$ and $R^5$ independently represents the same or a different organic group).

[Formula 3]

$$(R^6SiO_{3/2}) \quad (3)$$

(wherein $R^6$ is an organic group)

[Formula 4]

$$(SiO_{4/2}) \quad (4)$$

[Formula 5]

$$(R^7{}_a(OR^8)_{3-a}SiO_{1/2}) \quad (5)$$

(wherein a is 0, 1 or 2, each of $R^7$ and $R^8$ independently represents the same or a different organic group, and when two or more $R^7$s or $R^8$s are present, each $R^7$ or $R^8$ may be the same or different)

[Formula 6]

$$(R^9{}_b(OR^{10})_{2-b}SiO_{2/2}) \quad (6)$$

(wherein b is 0 or 1, each of $R^9$ and $R^{10}$ independently represents the same or a different organic group, and when two or more $R^{10}$s are present, each $R^{10}$ may be the same or different)

[Formula 7]

$$((OR^{11})SiO_{3/2}) \quad (7)$$

(wherein $R^{11}$ is an organic group).

The structural unit represented by Formula 1, i.e. the structural unit represented by the formula of $(R^1R^2R^3SiO_{1/2})$ is a mono-functional structural unit (M unit), the structural unit represented by Formula 2, i.e. the structural unit represented by the formula of $(R^4R^5SiO_{2/2})$ is a di-functional structural unit (D unit), the structural unit represented by Formula 3, i.e., the structural unit represented by the formula of $(R^8SiO_{3/2})$ is a tri-functional structural unit (T unit), and the structural unit represented by Formula 4, i.e., the structural unit represented by the formula of $(SiO_{4/2})$ is a quadra-functional structural unit.

In addition, the structural unit represented by Formula 5, i.e., the structural unit represented by the formula of $(R^7{}_a(OR^8)_{3-a}SiO_{1/2})$ is a structural unit in which a is 0, 1 or 2. The structural unit represented by Formula 5 is a di-functional structural unit represented by the formula of $(R^7{}_2(OR^8)SiO_{1/2})$ having one alkoxy group, $OR^8$, when a is 2; is a tri-functional structural unit represented by the formula of $(R^7(OR^8)_2SiO_{1/2})$ having two alkoxy groups, $OR^8$, when a is 1; and is a quadra-functional structural unit represented by the formula of $((OR^8)_3SiO_{1/2})$ having three alkoxy groups, $OR^8$, when a is 0.

The structural unit represented by Formula 6, i.e., the structural unit represented by the formula of $(R^9{}_b(OR^{10})_{2-b}SiO_{2/2})$ is a structural unit in which b is 0 or 1. The structural unit represented by Formula 6 is a tri-functional structural unit represented by the formula of $(R^9(OR^{10})SiO_{2/2})$ having one alkoxy group, $OR^{10}$, when b is 1; and is a quadra-functional structural unit represented by the formula of $((OR^{10})_2SiO_{2/2})$ having two alkoxy groups, $OR^{10}$, when b is 0.

The structural unit represented by Formula 7, i.e., the structural unit represented by the formula of $((OR^{11})SiO_{3/2})$ is a quadra-functional structural unit having two alkoxy groups, $OR^{11}$.

In the compound represented by Formula 1, each of $R^1$, $R^2$ and $R^3$ independently represents the same or a different organic group. In the compound represented by Formula 2, each of $R^4$ and $R^5$ independently represents the same or a different organic group. In the compound represented by Formula 3, $R^6$ is an organic group.

Additionally, in Formula 5, each of $R^7$ and $R^8$ independently represents the same or a different organic group. When two or more $R^7$s and two or more $R^8$s are present, each $R^7$ and each $R^8$ may be the same or different.

In the compound represented by Formula 6, each of $R^9$ and $R^{10}$ independently represents the same or a different organic group. When two or more $R^{10}$s are present, each $R^{10}$ may be the same or different.

In the compound represented by Formula 7, $R^{11}$ is an organic group.

Thus, each of the organic groups represented by $R^1$-$R^{11}$ independently represents the same or a different organic group.

Preferably, the organic group represented by $R^1$-$R^{11}$ is a hydrocarbon group, more preferably a C1-C12 hydrocarbon group, even more preferably a C1-C8 hydrocarbon group, still even more preferably a C1-C4 hydrocarbon group, still even much more preferably a C1-C3 hydrocarbon group, and particularly a C1-C2 hydrocarbon group.

Particular examples of the hydrocarbon group may include at least one selected from alkyl groups.

When the hydrocarbon group is an alkyl group, particular examples of the alkyl group may include at least one selected from methyl, ethyl, propyl, butyl, pentyl, hexyl, heptyl, octyl, nonyl, decyl, undecyl, dodecyl, and the like, methyl or ethyl is preferred, and methyl is more preferred.

In the curable resin composition disclosed herein, the alkoxy oligomer is preferably an alkoxy oligomer in which at least one of the organic groups contained in the structural units forming the alkoxy oligomer is a C1-C4 alkyl group, and the organic groups other than the alkyl group are C1-C8 hydrocarbon groups.

In addition, in the curable resin composition disclosed herein, the alkoxy oligomer is preferably an alkoxy oligomer in which at least one of the organic groups contained in the structural units forming the alkoxy oligomer is a methyl group, and all organic groups contained in the structural units forming the alkoxy oligomer are methyl groups.

In general, Si—O bonds as a backbone of silicone has about 50% of ionic binding, which is larger as compared to the C—C bonds in a general organic resin, such as polyethylene. Due to this, the chemical stability of C—H bonds or C—C bonds at the side chain of silicone is increased as compared to the backbone of C—C bonds. Generally, silicone has a structure not susceptible to oxidation of UV rays.

However, when side chains, such as C—H bonds or C—C bonds, are increased and the distance between the atom forming the side chain and Si atom is increased, there is a problem in that contribution to stabilization derived from the ionic binding of Si—O bonds is degraded. Due to this, it is preferred that the organic groups at the side chains (i.e., organic groups represented by $R^1$-$R^{11}$) have a smaller number of carbon atoms. Particularly, a methyl group is the smallest alkyl group, has a small distance between each atom forming a methyl group and Si atom (bound to methyl), facilitates stabilization through ionic binding, and includes no C—C bond. Thus, methyl is most preferred.

In addition, the organic groups represented by $R^1$-$R^{11}$ preferably include no aromatic ring.

For example, when an aromatic ring-containing group, such as a phenyl group, is used as an organic group represented by $R^1$-$R^{11}$, the functional group has a double bond, and thus $\pi$-$\pi$* transition derived from the $\pi$ electrons of the double bond causes absorption over a range from the UV region to the visible region, resulting in degradation of transmission in the UV region and UV resistance. Therefore, it is preferred that the organic groups represented by $R^1$-$R^{11}$ are those containing no aromatic rings, such as benzene-based aromatic rings, hetero-aromatic rings or non-benzene-based aromatic rings.

In addition, it is preferred that the organic groups represented by $R^1$-$R^{11}$ include no N atom-containing groups (such as an amino group) or S atom-containing groups (such as a mercapto group) in order to inhibit degradation of UV resistance. In addition, for the same reason, when the organic groups represented by $R^1$-$R^{11}$ are hydrocarbon groups other than aromatic hydrocarbon groups, it is preferred that they include no C—C bond (C—C bond, C=C bond or C≡C bond)-containing group.

As described above, in the curable resin composition disclosed herein, the alkoxy oligomer includes at least one structural unit selected from the group consisting of a structural unit represented by the following Formula 5 ($R^7_a(OR^8)_{3-a}SiO_{1/2}$), structural unit represented by the following Formula 6 ($R^9_b(OR^{10})_{2-b}SiO_{2/2}$) and a structural unit represented by the following Formula 7 (($OR^{11}$)$SiO_{3/2}$).

In the curable resin composition disclosed herein, the alkoxy oligomer includes alkoxy group-containing structural units selected from the group consisting of the structural units represented by Formula 5-Formula 7. Thus, it is thought that when the curable resin composition is used as a sealant for an optical semiconductor element forming an optical semiconductor device, the alkoxy groups are firmly bound chemically to a die surface, substrate surface, circuit pattern surface, etc. to be sealed.

In other words, since a protective layer including $SiO_2$ or the like is formed on the surface of a die including inorganic materials and such a surface generally has hydroxyl groups, the alkoxy groups in the structural units selected from the group consisting of the structural units represented by Formula 5-Formula 7 are bound to the hydroxyl groups of a die surface through hydrogen bonding or intermolecular force, such as Van der Waals force. In addition, it is though that some bonds are formed between the alkoxy groups and the hydroxyl groups of a die surface through dealcoholization-condensation and dehydration, and thus the both groups are chemically and firmly bound to each other.

Thus, when using the curable resin composition disclosed herein as a sealant, the cured product (solidified product) obtained by curing the curable resin composition is bound firmly to a die, or the like. By virtue of this, even when the curable resin composition is used for sealing a UV LED to which high power is applied, it is though that the cured product (solidified product) of the curable resin composition can be inhibited effectively from cracking or peeling.

In the curable resin composition disclosed herein, the alkoxy oligomer includes the structural units represented by Formula 1-Formula 7 in an amount of 90-100 mol %, preferably in an amount of 95-100 mol %, and even more preferably in an amount of 100 mol %, based on 100 mol % of the total siloxane units forming the alkoxy oligomer.

In other words, in the alkoxy oligomer according to the curable resin composition disclosed herein, the sum of the mol % of the structural units represented by Formula 1, mol % of the structural units represented by Formula 2, mol % of the structural units represented by Formula 3, mol % of the structural units represented by Formula 4, mol % of the structural units represented by Formula 5, mol % of the structural units represented by Formula 6 and the mol % of the structural units represented by Formula 7 is 90-100 mol %, preferably 95-100 mol %, and more preferably 100 mol % (the siloxane units forming the siloxane resin totally include any one of the structural units represented by Formula 1-Formula 7), based on 100 mol % of the total siloxane units forming the alkoxy oligomer.

In the structural units forming the alkoxy oligomer, the proportion of each of the structural units represented by Formula 1-Formula 7 is not particularly limited. However, when a predetermined amount of non-reactive functional groups are not present, curing of the curable resin composition provides an excessively hard cured product (solidified product) and the stress generated upon heating and cooling may not be relieved. In this case, the bonding wires in a UV LED may be cut or an LED die itself may be destroyed.

Therefore, in the curable resin composition disclosed herein, the alkoxy oligomer preferably has an atomic ratio of total O atoms to total Si atoms contained in the alkoxy oligomer (total O atoms contained in the alkoxy oligomer/total Si atoms contained in the alkoxy oligomer) of 2.3-3.5, more preferably 2.3-3.4, and even more preferably 2.2-3.2.

When the atomic ratio of total O atoms to total Si atoms contained in the alkoxy oligomer is within the above-defined range, it is possible for the alkoxy oligomer to include a predetermined amount of non-reactive functional groups, and thus it is possible to relieve the stress generated upon heating and cooling adequately.

When the atomic ratio of total O atoms to total Si atoms contained in the alkoxy oligomer is less than 2.3, UV resistance may be degraded. When the atomic ratio is larger than 3.5, the cured product (solidified product) of the curable resin may be cracked or broken with ease.

The atomic ratio of total O atoms to total Si atoms contained in the alkoxy oligomer may be controlled by adjusting the proportion of each of the structural units represented by Formula 1-Formula 7 forming the alkoxy oligomer.

In the curable resin composition disclosed herein, the alkoxy oligomer preferably has a predetermined range of ratios of the mole number of di-functional structural units to the sum of the mole number of di-functional structural units and the mole number of tri-functional structural units.

In other words, in the curable resin composition disclosed herein, the alkoxy oligomer preferably has a ratio of Tn/(Dn+Tn) of 0.2-1, more preferably 0.25-1, and even more preferably 0.3-1, when the sum of the mole number of the structural units ($R^7_2(OR^8)SiO_{1/2}$, i.e., structural units represented by Formula 5 ($R^7_a(OR^8)_{3-a}SiO_{1/2}$), wherein a is 2) and the mole number of the structural units represented by Formula 2, referred to as D units ($R^4R^5SiO_{2/2}$), is taken as Dn, and the sum of the mole number of the structural units ($R^7(OR^8)_2SiO_{1/2}$, i.e., structural units represented by Formula 5 ($R^7_a(OR^8)_{3-a}SiO_{1/2}$), wherein a is 1), the mole number of structural units ($R^9(OR^{10})SiO_{2/2}$, i.e., structural units represented by Formula 6 ($R^9_b(OR^{10})_{2-b}SiO_{2/2}$), wherein b is 1) and the mole number of the structural units represented by Formula 3, referred to as T units ($R^6SiO_{3/2}$), is taken as Tn.

The structural units ($R^7_2(OR^8)SiO_{1/2}$, i.e., structural units represented by Formula 5 ($R^7_a(OR^8)_{3-a}SiO_{1/2}$), wherein a is 2) are generally incorporated to the alkoxy oligomer during the preparation thereof, while the alkoxy groups in the starting material for the structural units represented by Formula 2 ($R^4R^5SiO_{2/2}$) partially remain in an unreacted state.

In addition, the structural units ($R^7(OR^8)_2SiO_{1/2}$, i.e., structural units represented by Formula 5 ($R^7_a(OR^8)_{3-a}SiO_{1/2}$), wherein a is 1) or the structural units ($R^9(OR^{10})SiO_{2/2}$, i.e., structural units represented by Formula 6 ($R^9_b(OR^{10})_{2-b}SiO_{2/2}$), wherein b is 1) are generally incorporated to the alkoxy oligomer during the preparation thereof, while the alkoxy groups in the starting material for the structural units represented by Formula 3 ($R^6SiO_{3/2}$) partially remain in an unreacted state.

As described above, when using the curable resin composition disclosed herein as a sealant for an optical semiconductor device forming an optical semiconductor system, the alkoxy group of the structural units represented by Formula 5-Formula 7 in the alkoxy oligomer are chemically and firmly bound to a die surface to be sealed. Considering a balance between alkoxy groups and organic groups in the alkoxy oligomer, it is preferred that the alkoxy oligomer totally includes di-functional structural units and tri-functional structural units. However, considering a binding between the sealant and a die, it is advisable that Tn is larger than Dn.

When the ratio represented by Tn/(Dn+Tn) is within the above-defined ratio, use of the curable resin composition as a sealant for an optical semiconductor device allows sufficient binding to a die surface. Even when using the curable resin for sealing a UV LED to which high power is applied and high-intensity UV light is irradiated thereto, it is possible to inhibit the interface between a die surface and the cured product (solidified product) of the curable resin composition from cracking or peeling.

In the curable resin composition disclosed herein, the alkoxy groups are present in an amount of 10-30 wt %, preferably 11-27.5 wt %, and more preferably 12-25 wt % in the alkoxy oligomer.

When the alkoxy groups are present in the alkoxy oligomer within the above-defined range, it is possible to retain a desired solid content, to inhibit three-dimensional binding, and to provide desired stress-relieving property.

In the curable resin composition disclosed herein, the weight average molecular weight of the alkoxy oligomer is not particularly limited and is selected suitably depending on its use. When the curable resin composition is used as a sealant for an optical semiconductor device, such as UV LED, any curable resin composition may be selected accordingly.

The alkoxy oligomer preferably has a weight average molecular weight of 500-4,500, more preferably 750-4,250, and even more preferably 1,000-4,000. In addition, the alkoxy oligomer includes hydroxyl (OH) groups in an amount of 15 wt % or less, preferably 10 wt % or less, and more preferably 5 wt % or less.

In the curable resin composition disclosed herein, there is no particular limitation in methods for preparing the alkoxy oligomer.

In the curable resin composition disclosed herein, the alkoxy oligomer may be obtained by combining a predetermined amount of each of organoxysiloxanes represented by the following Formula 1'-Formula 4' corresponding to each of the siloxane units represented by Formula 1-Formula 4, followed by hydrolysis and condensation:

[Formula 1']

$$R^{12}R^{13}R^{14}SiOR^{15} \tag{1'}$$

(wherein each of $R^{12}$, $R^{13}$, $R^{14}$ and $R^{15}$ independently represents the same or a different an organic group)

[Formula 2']

$$R^{16}R^{17}Si(OR^{18})(OR^{19}) \tag{2'}$$

(wherein each of $R^{16}$, $R^{17}$, $R^{18}$ and $R^{19}$ independently represents the same or a different organic group)

[Formula 3']

$$R^{20}Si(OR^{21})(OR^{22})(OR^{23}) \tag{3'}$$

(wherein each of $R^{20}$, $R^{21}$, $R^{22}$ and $R^{23}$ independently represents the same or a different organic group)

[Formula 4']

$$Si(OR^{24})(OR^{25})(OR^{26})(OR^{27}) \tag{4'}$$

(wherein each of $R^{24}$, $R^{25}$, $R^{26}$ and $R^{27}$ independently represents the same or a different organic group).

Particular examples of the organic groups represented by $R^{12}$-$R^{27}$ may include those of the organic groups represented by $R^1$-$R^{11}$ as mentioned above.

In the hydrolysis and condensation, hydrolysis does not go to completion but a predetermined amount of alkoxy groups are allowed to remain in the hydrolyzed product. Since a part of the alkoxy groups (—$OR^{18}$, —$OR^{19}$, —$OR^{21}$, —$OR^{22}$, —$OR^{23}$, —$OR^{24}$, —$OR^{25}$, —$OR^{26}$, —$OR^{27}$) forming the organoxysiloxanes represented by Formula 2'-Formula 4' still remain, it is possible to form at least one siloxane unit selected from the siloxane units represented by Formula 5-Formula 7 in the resultant alkoxy oligomer.

The residual amount of the alkoxy groups may be controlled by adjusting the conditions of hydrolysis and condensation (catalyst used therein, reaction time, reaction temperature, or the like).

The mixing ratio of the organoxysiloxanes represented by Formula 1'-Formula 4' may be selected suitably according to the alkoxy oligomer to be produced.

In the curable resin composition disclosed herein, according to a particular embodiment, the method for preparing an alkoxy oligomer includes hydrolyzing methyltrimethoxysilane (rational formula: $CH_3Si(OCH_3)_3$, abbreviated as MTMS hereinafter) or a mixture of MTMS with dimethyldimethoxysilane (rational formula: $(CH_3)_2Si(OCH_3)_2$, abbreviated as DMDMS hereinafter) in the presence of a catalyst and water.

In addition, the alkoxy oligomer in the curable resin composition may be a silicone alkoxy oligomer obtained by the methods other than the above-mentioned method.

Particular examples of the alkoxy oligomer may include silicone alkoxy oligomers available from Shinetsu Chemical Industry Co. Ltd., such as X-40-9225, X-40-9246, X-40-9250, KC-89S or KR-500, or XC-96-B0446, XR31-B1410 or XR31-B2230 available from Momentive Performance Materials Japan LLC.

In the curable resin composition disclosed herein, when the alkoxy oligomer is obtained by hydrolyzing and condensing the organoxysiloxanes represented by Formula 1'-Formula 4', the reaction may be carried out generally at a temperature of about 0-100° C. for several tens of minutes to one day.

Particular examples of the catalyst for use in hydrolysis and condensation of the organoxysiloxanes represented by Formula 1'-Formula 4' may include inorganic acids, such as hydrochloric acid, nitric acid, sulfuric acid, perchloric acid or phosphoric acid, and organic acids, such as formic acid and acetic acid. In addition, an organic acid may be added to carry out hydrolysis and condensation at the same time, as desired. In this case, particular examples of the solvent may include alcohols, such as methanol, ethanol, 1-propanol and 2-propanol, aromatic compounds, such as toluene and xylene, ketones such as acetone, and esters such as ethyl acetate.

In the organoxysiloxanes represented by Formula 1'-Formula 4', it is preferred that the organic groups represented by $R^{12}$-$R^{27}$ include no aromatic ring.

As described above, when an aromatic ring-containing group, such as a phenyl group, is used as an organic group represented by $R^{12}$-$R^{27}$, the functional group has a double bond, and thus π-π* transition derived from the π electrons of double bond causes absorption over a range from the UV region to the visible region, resulting in degradation of transmission in the UV region and UV resistance with ease. Therefore, it is preferred that the organic groups represented by $R^{12}$-$R^{27}$ are those containing no aromatic rings, such as benzene-based aromatic rings, hetero-aromatic rings or non-benzene-based aromatic rings.

In addition, it is preferred that the organic groups represented by $R^{12}$-$R^{27}$ include no N atom-containing groups (such as an amino group) or S atom-containing groups (such as a mercapto group) in order to inhibit degradation of UV resistance. In addition, for the same reason, when the organic groups represented by $R^{12}$-$R^{27}$ are hydrocarbon groups other than aromatic hydrocarbon groups, it is preferred that they include no C—C bond (C—C bond, C═C bond or C≡C bond)-containing group.

In the curable resin composition disclosed herein, it is preferred that the alkoxy oligomer is a silicone-based material having an organosiloxane structure present in a liquid state at room temperature (25° C.).

In the curable resin composition, when the alkoxy oligomer is present in a liquid state at room temperature (25° C.), it is possible to carry out packing and molding with ease.

In addition, in the present disclosure, the expression 'present in a liquid state at room temperature' means that the alkoxy oligomer has a viscosity of $10^3$ Pa·s or less at room temperature as determined according to the specification of JIS Z 8803.

The curable resin composition disclosed herein preferably includes the alkoxy oligomer in an amount of 20-85 wt %, more preferably 22.5-80 wt %, and even more preferably 25-75 wt %, as expressed by solid content (non-volatile content).

In the curable resin composition disclosed herein, when the amount of the alkoxy oligomer is within the above-defined range, the curable resin composition has significantly higher transparency in the UV region, UV resistance and heat resistance as compared to the conventional curable resin compositions. In addition, when using the curable resin composition disclosed herein for sealing a UV LED to which high power is applied, it is possible to inhibit cracking, peeling and coloration with ease.

Even when the curable resin composition includes the alkoxy oligomer alone as organopolysiloxane, it shows significantly high transparency in the UV region, UV resistance and heat resistance, and it can inhibit cracking, peeling or coloration to a certain degree even in the case of its use for sealing a UV LED to which high power is applied.

Meanwhile, curing of the alkoxy oligomer is performed by hydrolysis of alkoxy groups, dealcoholization-condensation subsequent to hydrolysis and dehydrocondensation. Since alcohol and water produced during such reactions are released from the solidified product during curing, the composition may undergo a decrease in volume and shrinking (i.e., deformation) during curing. Particularly, when a sealant is molded in a mold, a high degree of shrinking during curing may cause the resultant cured product (solidified product) to have a shape different from its desired shape. When such shrinking occurs uniformly, the mold shape may be designed according to an expected shrinking degree. However, as shrinking occurs to a higher degree during curing, uniform shrinking is not allowed and thus such designing of a mold shape is not available.

Therefore, in the curable resin composition according to the present disclosure, the silicone resin as described hereinafter is used in combination with the alkoxy oligomer and both of them are allowed to react with other during curing to produce and cure a specific organopolysiloxane, thereby increasing solid content and solving the above-mentioned technical problem.

[Silicone Resin]

The curable resin composition includes a silicone resin in combination with the alkoxy oligomer.

Silicone resins include straight resins containing a siloxane backbone alone and modified silicone resins modified with the other organic resins (e.g., epoxy resin-modified, alkyd resin-modified, polyester resin-modified, or the like). Since such modified silicone resins have low UV resistance in their organic resin portions, a so-called straight resin is used preferably as a silicone resin for the curable resin composition according to an embodiment.

In the curable resin composition according to the present disclosure, the silicone resin has an organopolysiloxane structure. The organopolysiloxane structure preferably has at least one structural unit selected from the structural unit represented by Formula 8, structural unit represented by Formula 9, structural unit represented by Formula 10 and the structural unit represented by Formula 11, in combination with at least one structural unit selected from the structural unit represented by Formula 12, structural unit represented by Formula 13 and the structural unit represented by Formula 14:

[Formula 8]

$(R^{28}R^{29}R^{30}SiO_{1/2})$ (8)

(wherein each of $R^{28}$, $R^{29}$ and $R^{30}$ independently represents the same or a different organic group)

[Formula 9]

$(R^{31}R^{32}SiO_{2/2})$ (9)

(wherein each of $R^{31}$ and $R^{32}$ independently represents the same or a different organic group)

[Formula 10]

$$(R^{33}SiO_{3/2}) \quad (10)$$

(wherein $R^{33}$ is an organic group)

[Formula 11]

$$(SiO_{4/2}) \quad (11)$$

[Formula 12]

$$(R^{34}{}_d(OH)_{3-d}SiO_{1/2}) \quad (12)$$

(wherein d is 0, 1 or 2, $R^{34}$ represents an organic group, and when two or more $R^{34}$s are present, each $R^{34}$ may be the same or different)

[Formula 13]

$$(R^{35}{}_e(OH)_{2-e}SiO_{2/2}) \quad (13)$$

(wherein e is 0 or 1, $R^{35}$ represents an organic group, and when two or more $R^{35}$s are present, each $R^{35}$ may be the same or different)

[Formula 14]

$$((OH)SiO_{3/2}) \quad (14)$$

The structural unit represented by Formula 8, i.e. the structural unit represented by the formula of $(R^{28}R^{29}R^{30}SiO_{1/2})$ is a mono-functional structural unit (M unit), the structural unit represented by Formula 9, i.e. the structural unit represented by the formula of $(R^{31}R^{32}SiO_{2/2})$ is a di-functional structural unit (D unit), the structural unit represented by Formula 10, i.e., the structural unit represented by the formula of $(R^{33}SiO_{3/2})$ is a tri-functional structural unit (T unit), and the structural unit represented by Formula 11, i.e., the structural unit represented by the formula of $(SiO_{4/2})$ is a quadra-functional structural unit.

In addition, the structural unit represented by Formula 12, i.e., the structural unit represented by the formula of $(R^{34}{}_d(OH)_{3-d}SiO_{1/2})$ is a structural unit in which a is 0, 1 or 2. The structural unit represented by Formula 12 is a di-functional structural unit represented by the formula of $(R^{34}{}_2(OH)SiO_{1/2})$ having one hydroxyl (OH) group, when d is 2; is a tri-functional structural unit represented by the formula of $(R^{34}(OH)_2SiO_{1/2})$ having two hydroxyl (OH) groups, when d is 1; and is a quadra-functional structural unit represented by the formula of $((OH)_3SiO_{1/2})$ having three hydroxyl (OH) groups, when d is 0.

The structural unit represented by Formula 13, i.e., the structural unit represented by the formula of $(R^{38}{}_e(OH)_{2-e}SiO_{2/2})$ is a structural unit in which e is 0 or 1. The structural unit represented by Formula 13 is a tri-functional structural unit represented by the formula of $(R^{38}(OH)SiO_{2/2})$ having one hydroxyl (OH) group, when e is 1; and is a quadra-functional structural unit represented by the formula of $((OH)_2SiO_{2/2})$ having two hydroxyl (OH) groups, when e is 0.

The structural unit represented by Formula 14, i.e., the structural unit represented by the formula of $((OH)SiO_{3/2})$ is a quadra-functional structural unit having one hydroxyl group.

In the compound represented by Formula 8, each of $R^{28}$, $R^{29}$ and $R^{30}$ independently represents the same or a different organic group. In the compound represented by Formula 9, each of $R^{31}$ and $R^{32}$ independently represents the same or a different organic group. In the compound represented by Formula 10, $R^{33}$ is an organic group.

Additionally, in Formula 12, $R^{34}$ represents an organic group. When two or more $R^{34}$s are present, each $R^{34}$ may be the same or different.

In the compound represented by Formula 13, $R^{35}$ represents an organic group. When two or more $R^{35}$s are present, each $R^{35}$ may be the same or different.

Thus, each of the organic groups represented by $R^{28}$-$R^{35}$ independently represents the same or a different organic group.

Preferably, the organic group represented by $R^{28}$-$R^{35}$ is a hydrocarbon group, more preferably a C1-C12 hydrocarbon group, even more preferably a C1-C8 hydrocarbon group, still even more preferably a C1-C4 hydrocarbon group, still even much more preferably a C1-C3 hydrocarbon group, and particularly a C1-C2 hydrocarbon group.

Particular examples of the hydrocarbon group may include at least one selected from alkyl groups.

When the hydrocarbon group is an alkyl group, particular examples of the alkyl group may include at least one selected from methyl, ethyl, propyl, butyl, pentyl, hexyl, heptyl, octyl, nonyl, decyl, undecyl, dodecyl, and the like, methyl or ethyl is preferred, and methyl is more preferred.

In the curable resin composition disclosed herein, the silicone resin is preferably a silicone resin in which at least one of the organic groups contained in the structural units forming the silicone resin is a C1-C4 alkyl group, and the organic groups other than the alkyl group are C1-C8 hydrocarbon groups.

In addition, in the curable resin composition disclosed herein, the silicone resin is preferably a silicone resin in which at least one of the organic groups contained in the structural units forming the silicone resin is a methyl group, and all organic groups contained in the structural units forming the silicone resin are methyl groups.

In general, Si—O bonds as a backbone of silicone has about 50% of ionic binding, which is larger as compared to the C—C bonds in a general organic resin, such as polyethylene. Due to this, the chemical stability of C—H bonds or C—C bonds at the side chain of silicone is increased as compared to the backbone of C—C bonds. Generally, silicone has a structure not susceptible to oxidation of UV rays.

However, as described hereinbefore with reference to the alkoxy oligomer, when side chains, such as C—H bonds or C—C bonds, are increased and the distance between the atom forming the side chain and Si atom is increased, there is a problem in that contribution to stabilization derived from the ionic binding of Si—O bonds is degraded. Due to this, it is preferred that the organic groups at the side chains (i.e., organic groups represented by $R^{28}$-$R^{35}$) have a smaller number of carbon atoms. Particularly, a methyl group is the smallest alkyl group, has a small distance between each atom forming a methyl group and Si atom (bound to methyl), facilitates stabilization through ionic binding, and includes no C—C bond. Thus, methyl is most preferred.

In general, straight resins may be classified broadly depending on the organic group bound to Si atom into methyl-based resins to which methyl groups are bound, phenyl-based resins to which phenyl groups are bound, methyl/phenyl-based resins to which methyl groups and phenyl groups are bound, and propyl/phenyl-based resins to which propyl groups and phenyl groups are bound.

In the curable resin composition according to the present disclosure, when the silicone resin is a straight resin, the straight resin preferably includes no aromatic ring, such as phenyl. Thus, it is preferred that the organic groups represented by $R^{28}$-$R^{35}$ include no aromatic ring, such as phenyl.

For example, when an aromatic ring-containing group, such as a phenyl group, is used as an organic group represented by $R^{28}$-$R^{35}$, the functional group has a double bond, and thus π-π* transition derived from the π electrons of the double bond causes absorption over a range from the UV region to the visible region, resulting in degradation of transmission in the UV region and UV resistance. Therefore, it is preferred that the organic groups represented by $R^{28}$-$R^{35}$ are those containing no aromatic rings, such as benzene-based aromatic rings, hetero-aromatic rings or non-benzene-based aromatic rings.

In addition, it is preferred that the organic groups represented by $R^{28}$-$R^{35}$ include no N atom-containing groups (such as an amino group) or S atom-containing groups (such as a mercapto group) in order to inhibit degradation of UV resistance. In addition, for the same reason, when the organic groups represented by $R^{28}$-$R^{35}$ are hydrocarbon groups other than aromatic hydrocarbon groups, it is preferred that they include no C—C bond (C—C bond, C=C bond or C≡C bond)-containing group.

As described above, in the curable resin composition disclosed herein, the silicone resin includes, as a structural unit having a hydroxyl group, at least one structural unit selected from the group consisting of a structural unit represented by the following Formula 12 ($R^{34}{}_d(OH)_{3-d}SiO_{1/2}$), structural unit represented by the following Formula 13 ($R^{35}{}_e(OH)_{2-e}SiO_{2/2}$) and a structural unit represented by the following Formula 14 (($OH)SiO_{3/2}$).

As described above, curing of the alkoxy oligomer is performed by hydrolysis of alkoxy groups, dealcoholization-condensation subsequent to hydrolysis and dehydrocondensation. Since alcohol and water produced during such reactions are released from the solidified product during curing, the composition may undergo a decrease in volume and shrinking (i.e., deformation) during curing.

In this context, according to the curable resin composition disclosed herein, the silicone resin includes hydroxyl group-containing structural units selected from the group consisting of the structural units represented by Formula 12-Formula 14. Thus, it is thought that when the curable resin composition is used as a sealant for an optical semiconductor element forming an optical semiconductor device, the alkoxy group contained in the alkoxy oligomer reacts with the hydroxyl group to form a siloxane bonding (Si—O—Si bonding) between the alkoxy oligomer and the silicone resin.

Since the amount of the byproducts (alcohol and water) produced during the reaction of the alkoxy oligomer with the silicone resin is smaller than that of the byproducts produced during the reaction of the alkoxy oligomer alone, it is possible to inhibit shrinking (deformation) during curing, as compared to the curable resin composition using the alkoxy oligomer alone.

In the curable resin composition disclosed herein, the silicone resin includes the structural units represented by Formula 8-Formula 14 in an amount of 90-100 mol %, preferably in an amount of 95-100 mol %, and even more preferably in an amount of 100 mol %, based on 100 mol % of the total siloxane units forming the silicone resin.

In other words, in the silicone resin according to the curable resin composition disclosed herein, the sum of the mol % of the structural units represented by Formula 8, mol % of the structural units represented by Formula 9, mol % of the structural units represented by Formula 10, mol % of the structural units represented by Formula 11, mol % of the structural units represented by Formula 12, mol % of the structural units represented by Formula 13, and the mol % of the structural units represented by Formula 14 is 90-100 mol %, preferably 95-100 mol %, and more preferably 100 mol % (the siloxane units forming the siloxane resin totally include any one of the structural units represented by Formula 8-Formula 14), based on 100 mol % of the total siloxane units forming the silicone resin.

In the structural units forming the silicone resin, the proportion of each of the structural units represented by Formula 8-Formula 14 is not particularly limited. However, when a predetermined amount of non-reactive functional groups are not present, curing of the curable resin composition provides an excessively hard cured product (solidified product) and the stress generated upon heating and cooling may not be relieved. In this case, the bonding wires in a UV LED may be cut or an LED die itself may be destroyed.

Therefore, in the curable resin composition disclosed herein, the silicone resin preferably has an atomic ratio of total O atoms to total Si atoms contained in the silicone resin (total O atoms contained in the silicone resin/total Si atoms contained in the silicone resin) of 2.3-3.5, more preferably 2.3-3.4, and even more preferably 2.2-3.2.

When the atomic ratio of total O atoms to total Si atoms contained in the silicone resin is within the above-defined range, it is possible for the silicone resin to include a predetermined amount of non-reactive functional groups, and thus it is possible to relieve the stress generated upon heating and cooling adequately.

When the atomic ratio of total O atoms to total Si atoms contained in the silicone resin is less than 2.3, UV resistance may be degraded. When the atomic ratio is larger than 3.5, the cured product (solidified product) of the curable resin may be cracked or broken with ease.

The atomic ratio of total O atoms to total Si atoms contained in the silicone resin may be controlled by adjusting the proportion of each of the structural units represented by Formula 8-Formula 14 forming the silicone resin.

In the curable resin composition disclosed herein, the hydroxyl groups are contained in the silicone resin in an amount of 0.1-10 wt %, preferably 0.2-5 wt %, and more preferably 0.3-2.5 wt % in the alkoxy oligomer.

When the hydroxyl groups are present in the silicone resin within the above-defined range, it is possible to inhibit shrinking during curing with ease, to form binding of the alkoxy groups of the alkoxy oligomer or hydroxyl groups produced by the hydrolysis thereof with the hydroxyl groups of the silicone resin through dealcoholization-condensation or dehydrocondensation, to provide a solidified product having a rigid structure with ease through the curing of the curable resin composition, to allow formation of binding with the hydroxyl groups of a die surface, substrate surface or printed circuit pattern surface through dehydrocondensation, and to form strong binding to the surface with ease.

In addition, the silicone resin includes alkoxy groups in an amount of 5 wt % or less, preferably 2.5 wt % or less, and more preferably 1.0 wt % or less.

In the curable resin composition disclosed herein, when the alkoxy groups are present in the silicone resin within the above-defined range, it is possible to inhibit shrinking during curing with ease.

In the curable resin composition disclosed herein, there is no particular limitation in methods for preparing the silicone resin.

In the curable resin composition disclosed herein, the silicone resin may be obtained by combining a predetermined amount of each of the silicon compounds represented by the following Formula 8'-Formula 11' corresponding to each of the siloxane units represented by Formula 8-Formula 11, followed by hydrolysis and condensation:

[Formula 8']

$$R^{36}R^{37}R^{18}SiOH \quad (8)'$$

(wherein each of $R^{36}$, $R^{37}$ and $R^{38}$ independently represents the same or a different an organic group)

[Formula 9']

$$R^{39}R^{40}Si(OH)_2 \quad (9)'$$

(wherein each of $R^{39}$ and $R^{40}$ independently represents the same or a different organic group)

[Formula 10']

$$R^{41}Si(OH)_3 \quad (10)'$$

(wherein each of $R^{41}$ represents an organic group)

[Formula 11']

$$Si(OH)_4 \quad (11)'$$

Particular examples of the organic groups represented by $R^{36}$-$R^{41}$ may include those of the organic groups represented by $R^{28}$-$R^{33}$ as mentioned above.

In the hydrolysis and condensation, hydrolysis does not go to completion but a predetermined amount of hydroxyl groups are allowed to remain in the hydrolyzed product. Since a part of the hydroxyl groups (—OH groups) forming the silicon compounds represented by Formula 8'-Formula 11' still remain, it is possible to form at least one siloxane unit selected from the siloxane units represented by Formula 12-Formula 14 in the resultant silicone resin.

The residual amount of the hydroxyl groups may be controlled by adjusting the conditions of hydrolysis and condensation (catalyst used therein, reaction time, reaction temperature, or the like).

The mixing ratio of the silicon compounds represented by Formula 8'-Formula 11' may be selected suitably according to the silicone resin to be produced.

In the curable resin composition disclosed herein, silicone resin may be a silicone resin obtained by the methods other than the above-mentioned method.

Particular examples of the alkoxy oligomer may include silicone resins available from Shinetsu Chemical Industry Co. Ltd., such as KR-220L or KR-220LP, YR3370 available from Momentive Performance Materials Japan LLC, SILRES MK or SILRES 610 available from Asahi Kasei Co., Ltd., or the like.

In the curable resin composition disclosed herein, when the silicone resin is obtained by hydrolyzing and condensing the silicon compounds represented by Formula 8'-Formula 11', the reaction may be carried out generally at a temperature of about 0-100° C. for several tens of minutes to one day.

Particular examples of the catalyst for use in hydrolysis and condensation of the organoxysiloxanes represented by Formula 8'-Formula 11' may include inorganic acids, such as hydrochloric acid, nitric acid, sulfuric acid, perchloric acid or phosphoric acid, and organic acids, such as formic acid and acetic acid. In addition, an organic acid may be added to carry out hydrolysis and condensation at the same time, as desired. In this case, particular examples of the solvent may include alcohols, such as methanol, ethanol, 1-propanol and 2-propanol, aromatic compounds, such as toluene and xylene, ketones such as acetone, and esters such as ethyl acetate.

In the silicon compounds represented by Formula 8'-Formula 11', it is preferred that the organic groups represented by $R^{36}$-$R^{41}$ include no aromatic ring.

As described above, when an aromatic ring-containing group, such as a phenyl group, is used as an organic group represented by $R^{36}$-$R^{41}$, the functional group has a double bond, and thus π-π* transition derived from the π electrons of double bond causes absorption over a range from the UV region to the visible region, resulting in degradation of transmission in the UV region and UV resistance with ease. Therefore, it is preferred that the organic groups represented by $R^{36}$-$R^{41}$ are those containing no aromatic rings, such as benzene-based aromatic rings, hetero-aromatic rings or non-benzene-based aromatic rings.

In addition, it is preferred that the organic groups represented by $R^{36}$-$R^{41}$ include no N atom-containing groups (such as an amino group) or S atom-containing groups (such as a mercapto group) in order to inhibit degradation of UV resistance. In addition, for the same reason, when the organic groups represented by $R^{36}$-$R^{41}$ are hydrocarbon groups other than aromatic hydrocarbon groups, it is preferred that they include no C—C bond (C—C bond, C═C bond or C≡C bond)-containing group.

In the curable resin composition disclosed herein, the weight average molecular weight of the silicone resin is not particularly limited and may be selected suitably depending on the purpose of use. When the curable resin composition is used as a sealant for an optical semiconductor device, such as UV LED, the weight average molecular weight of the silicone resin may be selected suitably depending on the same use.

The silicone resin preferably has a weight average molecular weight larger than 4,000 and equal to or smaller than 20,000, more preferably larger than 4,250 and equal to or smaller than 17,500, and most preferably larger than 4,500 and equal to or smaller than 15,000.

In the curable resin composition disclosed herein, it is preferred that the silicone resin is a silicone-based material having an organosiloxane structure present in a solid state at room temperature (25° C.).

In the curable resin composition, when the silicone resin is present in a solid state at room temperature (25° C.), the silicone resin may have a smaller number of reactive functional groups as compared to a liquid-state silicone resin and shrinking during curing may be inhibited effectively.

Since a silicone resin present in a solid state at room temperature (25° C.) has a larger molecular weight as compared to a silicone resin present in a liquid state at room temperature (25° C.), a silicone resin having a molecular weight within a predetermined range may be selected suitably.

Even when a silicone resin has a large molecular weight, it causes solvent evaporation during curing to increase shrinking during curing once it is present in a liquid state after dissolution in a solvent. Thus, such a silicone resin is not included in the scope of the silicone resin for use in the curable resin composition disclosed herein.

In addition, in the present disclosure, the expression 'present in a solid state at room temperature' means that the silicone resin has a viscosity higher than $10^2$ Pa·s at room temperature as determined according to the specification of JIS Z 8803.

The curable resin composition disclosed herein preferably includes the silicone resin in an amount of 15-80 wt %, more preferably 20-77.5 wt %, and even more preferably 25-75 wt %, as expressed by solid content (non-volatile content).

In the curable resin composition disclosed herein, when the amount of the silicone resin is within the above-defined range, the curable resin composition has significantly higher transparency in the UV region, UV resistance and heat resistance as compared to the conventional curable resin compositions. In addition, when using the curable resin composition disclosed herein for sealing a UV LED to which high power is applied, it is possible to inhibit cracking, peeling and coloration with ease. Further, it is possible to effectively inhibit shrinking during curing.

Although a silicone resin is cured when it is heated at a high temperature (such as 200° C. or more), it shows thermoplastic property (remelting property) at a temperature lower than the curing temperature. Therefore, when the amount of the silicone resin is increased, the silicone resin still has its properties even after mixing with an alkoxy oligomer, and thus easily shows thermoplastic property unless it is cured at low temperature. In addition, when such thermoplastic property still remains, in the case of the use for sealing a UV LED, the resin may be heated and deformed (remolten) with ease due to the heat emission of the UV LED.

Although high-temperature heating causes loss (curing) of thermoplastic property (remelting property), heat treatment carried out at high temperature may cause damages on the chip body of a UV LED. The curable resin composition disclosed herein having a proportion of a silicone resin within the above-defined range (expressed as solid content) includes a predetermined amount of an alkoxy oligomer. Thus, the curable resin composition disclosed herein may be cured with ease even at a low temperature (junction temperature of a UV LED (e.g., about 120° C. or lower)). Therefore, it is possible to provide a curable resin composition whose solidified product does not show thermoplastic property.

[Curing Catalyst]

The curable resin composition disclosed herein may include a curing catalyst.

In the curable resin composition disclosed herein, the alkoxy oligomer and the silicone resin produce a specific organopolysiloxane even in the absence of a catalyst and allow a curing reaction. However, the curable resin composition may further include a curing catalyst in order to accelerate the curing of the curable resin composition.

According to an embodiment, the curing catalyst may be phosphoric acid ($H_3PO_4$) which is provided preferably in the form of a mixed solution of phosphoric acid ($H_3PO_4$) with alkoxysilane. Particularly, a mixed solution of dimethyl-dimethoxysilane (DMDMS) with aqueous orthophosphoric acid (rational formula: $H_3PO_4$) may be used.

Aqueous ortho-phosphoric acid solution contains $H_2O$, which is consumed completely through the reaction with methoxy groups ($CH_3O-$) in DMDMS, as represented by the following reaction scheme

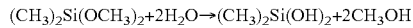

$(CH_3)_2Si(OCH_3)_2 + 2H_2O \rightarrow (CH_3)_2Si(OH)_2 + 2CH_3OH$

In addition, although the above-mentioned preparation of a curing catalyst uses DMDMS as alkoxysilane to be combined with ortho-phosphoric acid, the alkoxysilane represented by the following Formula may also be used:

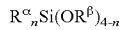

$R^{\alpha}_n Si(OR^{\beta})_{4-n}$ (wherein $R^{\alpha}$ is an organic group represented by the formula of $C_kH_{2k+1}-$ (wherein k=1, 2) and $R^{\beta}$ is an organic group represented by the formula of $C_mH_{2m-1}-$ (wherein m=1, 2, 3, 4 or 5), when two or more $R^{\alpha}$s are present, each $R^{\alpha}$ is the same or different, when two or more $R^{\beta}$s are present, each $R^{\beta}$ is the same or different, and n is an integer of 0-3).

In addition, when the added amount of phosphoric acid ($H_3PO_4$) is excessively large, the curable resin composition undergoes an increase in viscosity and is not amenable to casting to a UV LED. Thus, phosphoric acid is added in an amount of 0.1-20 parts by weight, preferably 0.2-15.0 parts by weight, based on 100 parts by weight of the alkoxy oligomer.

Further, as a curing catalyst, bis(lauroxydibutyltin)oxide, organometal compounds, such as alkoxides of at least one metal selected from Al, Zr, Nb and Ta, amines, such as monoethanolamine, may be used.

[Preparation of Curable Resin Composition]

The method for preparing the curable resin composition disclosed herein is not particularly limited, but any conventional method may be used for preparing the curable resin composition, as long as it allows uniform mixing of the alkoxy oligomer and the silicone resin, optionally with a curing catalyst.

For example, the curable resin composition disclosed herein may be obtained by mixing the alkoxy oligomer and the silicone resin, optionally with a curing catalyst, for a predetermined time, followed by debubbling.

[Curing of Curable Resin Composition]

The curable resin composition disclosed herein is present in a liquid state at room temperature. Thus, when using the curable resin composition as a sealant for a UV LED, a predetermined amount of the curable resin composition is cast into a UV LED package, followed by heating and drying for a predetermined time.

In addition, the heating condition is not particularly limited, as long as it allows the curable resin composition to be cured into a desired state. For example, it is preferred to carry out heating at 100-200° C. for about 1-2 hours.

In the curable resin composition, the solidified product obtained by curing the curable resin composition has a shrinkage of 10 wt % or less during curing, preferably of 9 wt % or less, and more preferably of 8 wt % or less.

Since the curable resin composition disclosed herein includes an alkoxy oligomer and a silicone resin as essential ingredients, it is possible to inhibit shrinking during curing effectively even when the curable resin composition is used for sealing a UV LED to which high power is applied.

In addition, as used herein, the 'shrinkage during curing' may be calculated from the weights of the curable resin composition before and after heating and curing according to the following formula:

Shrinkage during curing (wt %)={(weight (g) of curable resin composition before curing−weight (g) of solidified product after curing)/weight (g) of curable resin composition before curing}×100

The solidified product obtained by curing the curable resin composition disclosed herein shows a UV transmission of 85% or more, preferably of 87.5% or more, and more preferably of 90% or more, when UV light is irradiated to the solidified product at a luminous intensity of 100 W/cm² for 500 hours.

The solidified product obtained by curing the curable resin composition disclosed herein shows a UV transmission of 85% or more, preferably of 87.5% or more, and more preferably of 90% or more, when UV light is irradiated to the solidified product at a luminous intensity of 100 W/cm² for 1000 hours.

The solidified product obtained by curing the curable resin composition disclosed herein shows a UV transmission of 80% or more, preferably of 85% or more, and more preferably of 90% or more, when UV light is irradiated to the solidified product at a luminous intensity of 100 W/cm$^2$ for 5000 hours.

The UV light with a luminous intensity of 100 W/cm$^2$ may have a light emission peak wavelength of 365 nm.

The curable resin composition disclosed herein inhibits cracking, peeling or coloration even when it is used for sealing a UV LED to which high power is applied, and also inhibits shrinking during curing. In addition, since the curable resin composition has excellent transparency in the UV region, it is possible to accomplish such a high transmission with ease.

As described above, according to the present disclosure, it is possible to provide a curable resin composition having higher transparency in the UV region, UV resistance and heat resistance as compared to the conventional curable resin composition, capable of inhibiting cracking, peeling or coloration even when used for sealing a UV LED to which high power is applied or used as a material for optical elements, and capable of inhibiting shrinking during curing.

[Optical Element]

Hereinafter, the optical element according to the present disclosure will be explained.

The optical element includes the cured product of the curable resin composition disclosed herein.

Detailed description of the curable resin composition is the same as the above.

The optical element may be selected from a lens (positive convex lens, positive concave lens, convex and concave lens, planar convex lens, planar concave lens, cylindrical lens, or the like), prism, rod, diffraction grid, and the like.

For example, the optical element disclosed herein may be manufactured by filling the curable resin composition disclosed herein into a lower mold of a pair of molds having an upper mold and lower mold having a surface shape corresponding to the shape of a optical element to be obtained, compressing the upper mold from the top to form a preformed body of the optical element, and carrying out curing. The detailed curing conditions are the same as described above with reference to the part, [Curing of Curable Resin Composition].

According to the present disclosure, it is possible to provide an optical element that has higher transparency in the UV region, UV resistance and heat resistance, inhibits cracking or coloration even when used for a light source emitting UV light with high luminous intensity, and inhibits shrinking during curing.

[Optical Semiconductor Device]

Hereinafter, the optical semiconductor device according to the present disclosure will be described.

The optical semiconductor device according to the present disclosure has at least one of an optical semiconductor element sealed with the curable resin composition disclosed herein and the optical element according to the present disclosure. The optical semiconductor device may include one that emits light in the UV region.

Hereinafter, some embodiments of the optical semiconductor device according to the present disclosure will be described based on the embodiments of the curable resin composition disclosed herein.

As described above, the curable resin composition according to an embodiment is suitable for a sealant for a UV LED to which high power is applied, for example.

Figure 2:
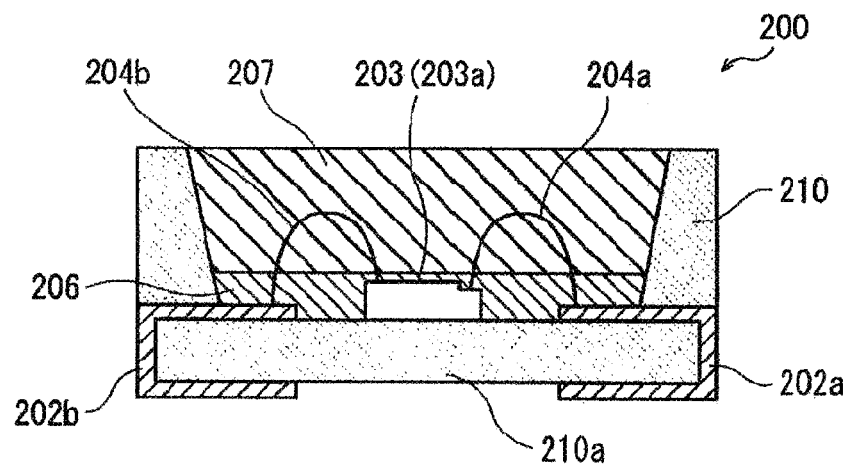
FIG. 2 is a schematic view illustrating a package type UV LED to which the curable resin composition according to an embodiment is applied.

FIG. 1 is a schematic view (sectional view) illustrating a surface mount type UV LED 100 using the curable resin composition according to an embodiment. In addition, FIG. 2 is a schematic view (sectional view) illustrating a package type UV LED 200 using the curable resin composition according to an embodiment.

As shown in FIG. 1, the UV LED 100 includes a substrate 101, LED die 103, or the like. The substrate 101 is a so-called circuit board including an insulating material (such as ceramic (aluminum nitride, alumina, silicon nitride, silicon carbide, etc.)). As shown in FIG. 1, the surface of the substrate 101 has a cathode pattern 102a and an anode pattern 102b including a conductive metallic material (such as copper, aluminum, etc.).

The LED die 103 has a square column-like shape, the top surface (exit surface 103a) thereof is provided with a cathode terminal (not shown) and the bottom surface thereof is provided with an anode terminal (not shown). The bottom surface (anode terminal) of the LED die 103 is connected mechanically and electrically with the cathode pattern 102a through a die bonding agent (not shown). In addition, the cathode terminal provided on the top surface of the LED die 103 is joined electrically with the anode pattern 102b through a bonding wire 104. In addition, when electric current is applied between the anode terminal and the cathode terminal through the cathode pattern 102a and the anode pattern 102b, UV light (for example, UV light having a wavelength of 365 nm) is generated from the light-emitting layer (not shown) in the LED die 103 and exits from the exit surface 103a.

A frame material 105 is installed around the LED die 103, and the LED die 103 inside the frame material 105 is sealed with a solidified product 106 of the curable resin composition according to an embodiment.

For example, a method for fabricating the UV LED 100 as shown in FIG. 1 includes carrying out die bonding of the LED die 103 to the cathode pattern 102a, carrying out wire bonding of the cathode terminal of the LED die 103 with the anode pattern 102b by way of the bonding wire 104, filling the inside of the frame material 105 with the curable resin composition disclosed herein, and then heating and curing the curable resin composition at 100-200° C. for 1-2 hours.

The UV LED 200 as shown in FIG. 2 is different from the UV LED 100 as shown in FIG. 1 in that the UV LED 200 has a cathode terminal (not shown) and an anode terminal (not shown) formed on the top surface (exit surface 203a) of the LED die 203, the LED die 203 is received in a casing 210, and another solidified product 207 is provided on the solidified product 206 of the curable resin composition disclosed herein.

As shown in FIG. 2, the UV LED 200 includes a casing 210, an LED die 203, or the like. The casing 210 is a bowl-like member formed of an insulating material (such as ceramic). As shown in FIG. 2, a cathode pattern 202a and an anode pattern 202b are formed on the bottom portion 210a of the casing 210 in such a manner that they may be drawn from the inner part of the casing 210 toward the outer part thereof.

The LED die 203 has a square column-like shape and the top surface (i.e., exit surface 203a) thereof has a cathode terminal (not shown) and an anode terminal (not shown). The bottom surface of the LED die 203 is fixed to the bottom portion 210a of the casing 210 through a die bonding agent (not shown). In addition, the anode terminal on the top surface 203 of the LED die is joined electrically with the cathode pattern 202a through a bonding wire 204a, and the cathode terminal on the top surface of the LED die 203 is joined electrically with the anode pattern 202b through a bonding wire 204b. In addition, when electric current is applied between the anode terminal and the cathode terminal through the cathode pattern 202a and the anode pattern 202b, UV light (for example, UV light having a wavelength of 365 nm) is generated from the light-emitting layer (not shown) in the LED die 203 and exits from the exit surface 203a.

The LED die 203 is surrounded with the wall surfaces of the casing 210, and the LED die inside the casing 210 is sealed with a solidified product 206 of the curable resin composition disclosed herein. In addition, a solidified product 207 of another curable resin composition different from the curable resin composition disclosed herein in terms of refractive index or elastic modulus is formed on the solidified product 206.

For example, a method for fabricating the UV LED 200 as shown in FIG. 2 includes carrying out die bonding of the LED die 203 to the inner part of the casing 210, carrying out wire bonding of the anode terminal and the cathode terminal of the LED die 203 with the cathode pattern 202a and the anode pattern 202b, respectively, by way of the bonding wire 204a, 204b, filling the inside of the casing 210 with the curable resin composition disclosed herein, heating and curing the curable resin composition at 100-200° C. for 1-2 hours, filling another curable resin composition for the solidified product 207, and then curing the curable resin composition for the solidified product 207 by heating it at a predetermined temperature for a predetermined time.

As described above, according to the present disclosure, it is possible to provide an optical semiconductor device using a curable resin composition that has higher transparency in the UV region, UV resistance and heat resistance as compared to the conventional curable resin composition, capable of inhibiting cracking, peeling or coloration even when used for sealing a UV LED to which high power is applied or used as a material for optical elements, and capable of inhibiting shrinking during curing.

EXAMPLES

Hereinafter, the present disclosure will be explained in detail with reference to examples and comparative examples. However, the following examples and experiments are for illustrative purposes only and not intended to limit the scope of this disclosure.

Example 1

Preparation of Curing Catalyst

While 100.00 g of Z-6329 available from Toray-Dow Corning Co., Ltd. (chemical name: dimethyl dimethoxysilane (DMDMS), rational formula $(CH_3)_2Si(OCH_3)_2$, molecular weight: 120.2) cooled in an ice bath is agitated, 25.93 g of aqueous ortho-phosphoric acid solution (ration formula: $H_3PO_4$) ($H_3PO_4$ concentration: 85%) is added dropwise thereto over 15 minutes, followed by mixing, and the reaction mixture is further mixed at room temperature for 1 hour to obtain a phosphoric acid-based curing catalyst $H_3PO_4$.

Although ortho-phosphoric acid contains 15 wt % of $H_2O$, it is consumed completely through the reaction of $H_2O$ with the methoxy groups ($CH_3O-$) of DMDMS as shown in the Reaction Formula of $(CH_3)_2Si(OCH_3)_2+2H_2O \rightarrow (CH_3)_2Si(OH)_2+2CH_3OH$. In addition, the curing catalyst $H_3PO_4$ contained in the obtained liquid has a concentration of 17.5 wt %.

Preparation of Curable Resin Composition

To 40.0 g of siliconalkoxy oligomer X-40-9225 (containing methyl groups alone as organic groups, containing methoxy groups alone as alkoxy groups, alkoxy group content: 24 wt %, $SiO_2$ content: 67 wt %, atomic ratio represented by total amount of 0 atoms/total amount of Si atoms: 3.0, Tn/(Dn+Tn)=100) available from Shin-etsu Chemical Industry Co. Ltd., including a tri-functional structural unit (at least one structural unit selected from the structural unit represented by Formula 3, the structural unit represented by Formula 5 wherein a is 1, the structural unit represented by Formula 6 wherein b is 1 and the structural unit represented by Formula 7) alone and present in a liquid state at room temperature (25° C.), 60.0 g of silicone resin KR-220LP (containing methyl groups as organic groups, non-volatile content: 99.0 wt %, hydroxyl group content: 3.0 wt %) available from Shin-etsu Chemical Industry Co. Ltd., including a tri-functional structural unit (at least one structural unit selected from the structural unit represented by Formula 10, the structural unit represented by Formula 12 wherein d is 1, the structural unit represented by Formula 13 wherein e is 1 and the structural unit represented by Formula 14) and present in a solid state at room temperature (25° C.) is added, and the materials are agitated and dissolved for 30 minutes by using a revolution/rotation mixer (ARE-250 available from Shinki Co. Ltd.). Then, 0.20 g of the phosphoric acid-based curing catalyst is added thereto and the reaction mixture is further agitated for 1 minute to obtain a transparent viscous liquid.

Then, the viscous liquid is transferred to a glass container for use in a rotary evaporator and debubbling is carried out for 3 minutes by using a revolution/rotation mixer. After that, the glass container in which viscous liquid is received is attached to the rotary evaporator, depressurization is carried out for 30 minutes while carrying out warming to 50° C., and methanol and $H_2O$ generated by the reaction between the silicon alkoxy oligomer X-40-9225 and the silicone resin KR-220 LP are removed by distillation to obtain a transparent and homogeneous viscous liquid (curable resin composition).

(Preparation of Solidified Product)

The resultant liquid is subjected to positive casting in a schale made of a perfluoroalkoxy fluororesin (PFA) and having an inner diameter of 50 mm and a height of 12 mm into a solidified product having a thickness of 1 mm. Then, heat treatment is carried out at 110° C. for 2 hours and at 150° C. for 2 hours to obtain a solidified product having a thickness of 1 mm.

Example 2

First, to 25.0 g of the siliconalkoxy oligomer X-40-9225 of Example 1 available from Shin-etsu Chemical Industry Co. Ltd. and present in a liquid state at room temperature (25° C.), 75.0 g of silicone resin KR-220L (containing methyl groups as organic groups, non-volatile content: 99.0 wt %, hydroxyl group content: 3.0 wt %) available from Shin-etsu Chemical Industry Co. Ltd., including a tri-functional structural unit (at least one structural unit selected from the structural unit represented by Formula 10, the structural unit represented by Formula 12 wherein d is 1, the structural unit represented by Formula 13 wherein e is 1 and the structural unit represented by Formula 14) and present in a solid state at room temperature (25° C.) is added, and the materials are agitated and dissolved for 3.5 hours at 100° C. to obtain a transparent viscous liquid.

Then, 1.25 g of the phosphoric acid-based catalyst used in Example 1 is added to the resultant viscous liquid and the reaction materials are mixed for 2 minutes by using a revolution/rotation mixer to obtain a transparent and homogeneous liquid (curable resin composition).

The resultant liquid is subjected to positive casting in a schale made of PFA in the same manner as Example 1. Then, heat treatment is carried out at 110° C. for 2 hours and at 150° C. for 2 hours to obtain a solidified product having a thickness of 1 mm.

Example 3

Example 2 is repeated to obtain a transparent and homogeneous liquid (curable resin composition), and then a solidified product having a thickness of 1 mm, except the following: as an alkoxy oligomer, 50.0 g of siliconalkoxy oligomer X-40-9246 (containing methyl groups alone as organic groups, containing methoxy groups alone as alkoxy groups, alkoxy group content: 12 wt %, $SiO_2$ content: 72 wt %, atomic ratio represented by total amount of 0 atoms/total amount of Si atoms: 2.5, $Tn/(Dn+Tn)=0.54$) available from Shin-etsu Chemical Industry Co. Ltd., including 46 mol % of a difunctional structural unit (at least one structural unit selected from the structural unit represented by Formula 2, the structural unit represented by Formula 5 wherein a is 2 and the structural unit represented by Formula 6 wherein b is 0) and 54 mol % of a trifunctional unit (at least one structural unit selected from the structural unit represented by Formula 3, the structural unit represented by Formula 5 wherein a is 1, the structural unit represented by Formula 6 wherein b is 1 and the structural unit represented by Formula 7), when the total structural units forming the alkoxy oligomer is taken as 100%, and present in a liquid state at room temperature (25° C.) is used, and 50.0 g of the silicone resin KR-220L used in Example 2, available from Shin-etsu Chemical Industry Co. Ltd. and present in a solid state at room temperature (25° C.) and 2.5 g of the phosphoric acid-based catalyst used in Example 1 are used.

Example 4

Example 2 is repeated to obtain a transparent and homogeneous liquid (curable resin composition), and then a solidified product having a thickness of 1 mm, except that 80.0 g of siliconalkoxy oligomer X-40-9225 available from Shin-etsu Chemical Industry Co. Ltd. and present in a liquid state at room temperature (25° C.), 20.0 g of the silicone resin KR-220L available from Shin-etsu Chemical Industry Co. Ltd. and present in a solid state at room temperature (25° C.), and 4.0 g of the phosphoric acid-based catalyst are used.

Example 5

Example 2 is repeated to obtain a transparent and homogeneous liquid (curable resin composition), and then a solidified product having a thickness of 1 mm, except that the amount of siliconalkoxy oligomer X-40-9225 available from Shin-etsu Chemical Industry Co. Ltd. is changed from 25.0 g to 50.0 g, and 50.0 g of silicone resin YR3770 (containing methyl groups alone as organic groups, non-volatile content: 99.5 wt %, hydroxyl group content: 1.5 wt %) available from Momentive Performance Materials Japan Co. Ltd., including a trifunctional structural group alone (at least one structural unit selected from the structural unit represented by Formula 10, the structural unit represented by Formula 12 wherein d is 1, the structural unit represented by Formula 13 wherein e is 1 and the structural unit represented by Formula 14) and present in a solid state at room temperature (25° C.) is used instead of silicone resin KR-220L.

Example 6

Example 2 is repeated to obtain a transparent and homogeneous liquid (curable resin composition), and then a solidified product having a thickness of 1 mm, except that the amount of siliconalkoxy oligomer X-40-9225 available from Shin-etsu Chemical Industry Co. Ltd. and present in a liquid state at room temperature (25° C.) is changed into 50.0 g, the amount of silicone resin KR-220L available from Shin-etsu Chemical Industry Co. Ltd. and present in a solid state at room temperature (25° C.) is changed into 50.0 g, and 0.50 g of bis(lauroxydibutyltin) oxide is used instead of the phosphoric acid-based catalyst.

Comparative Example 1

Example 2 is repeated to obtain a transparent and homogeneous liquid (curable resin composition), and then a solidified product having a thickness of 1 mm, except that the amount of siliconalkoxy oligomer X-40-9225 available from Shin-etsu Chemical Industry Co. Ltd. and present in a liquid state at room temperature (25° C.) is changed into 90.0 g, the amount of silicone resin KR-220L available from Shin-etsu Chemical Industry Co. Ltd. and present in a solid state at room temperature (25° C.) is changed into 10.0 g, and 4.5 g of the phosphoric acid-based catalyst is used.

Comparative Example 2

Example 2 is repeated to obtain a transparent and homogeneous liquid (curable resin composition), and then a solidified product having a thickness of 1 mm, except that the amount of siliconalkoxy oligomer X-40-9225 available from Shin-etsu Chemical Industry Co. Ltd. and present in a liquid state at room temperature (25° C.) is changed into 15.0 g, the amount of silicone resin KR-220L available from Shin-etsu Chemical Industry Co. Ltd. and present in a solid state at room temperature (25° C.) is changed into 85.0 g, and 0.75 g of the phosphoric acid-based catalyst is used.

[Evaluation and Determination]

Each of the curable resin compositions according to Examples 1-6 and Comparative Examples 1-2 is evaluated and determined for shrinking during curing, remelting property after curing, transmission and UV resistance according to the following methods. The results are shown in the following Tables 1 and 2.

(Determination of Shrinkage During Curing)

The shrinkage of a curable resin composition during curing is calculated from the weight of the curable resin composition before and after it is heated and cured according to the following formula:

Shrinkage during curing (wt %)={(weight (g) of curable resin composition before curing−weight (g) of solidified product after curing)/weight (g) of curable resin composition before curing}×100

In addition, the results of determination of shrinkage during curing are shown in Tables 1 and 2 as 'shrinkage during curing' and a shrinkage during curing of 10 wt % or less is judged as 'passed'.

(Evaluation for Remelting Property after Curing)

The solidified product of each of the curable resin compositions obtained from Examples 1-6 and Comparative Examples 1-2 is heated on a hot plate for 5 minutes at 120°

C., 150° C. and 180° C. Then, the solidified product is evaluated by determining whether it is softened and deformed is determined by the naked eyes.

The evaluation results are shown in Tables 1 and 2 as 'remelting after curing', wherein a solidified product that undergoes no softening and deformation is expressed by 'No' and a solidified product that undergoes softening and deformation is expressed by 'Yes'.

(Determination and Evaluation for Transmission)

The transmission of the solidified product of each of the sealants (curable resin compositions) is determined by using the UV-Vis spectrophotometer U-4100 available from Hitachi Technology Co., Ltd, in a wavelength range of 250-550 nm. Then, the minimum transmission in a wavelength range of 300-350 nm is evaluated.

Figure 3:
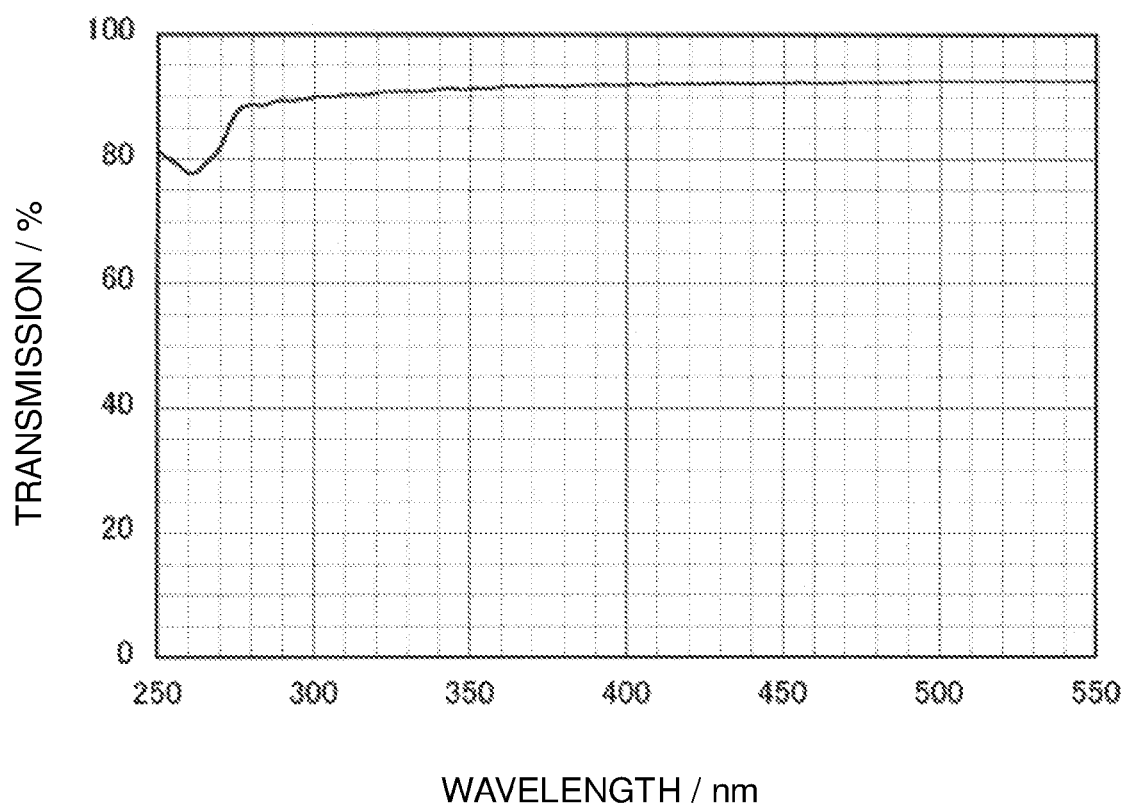
FIG. 3 is a graph illustrating the results of transmission measurement of the curable resin composition according to Example 1.

FIG. 3 is a graph illustrating the results of determination of transmission and shows the results of determination of the transmission of the solidified product of the curable resin composition according to Example 1.

In Example 1, the minimum transmission in a wavelength range of 300-350 nm is evaluated as 90.0% from FIG. 3. In this manner, the results of determination of the minimum transmission in a wavelength range of 300-350 nm are shown in Tables 1 and 2 as 'TMin$_{300-350}$' based on the results of determination of the transmission of each sealant (curable resin composition). In addition, when 'Tmin$_{300-350}$' is 85% or more, the sealant is judged as 'passed'.

(Evaluation for UV Resistance)

A package type UV LED:NC4U133B (light emission peak wavelength: 365 nm) from which the glass window is removed is mounted to an aluminum-made star substrate. Next, the star substrate is fixed to an aluminum-made heat sink with a screw through a spacer made of Teflon (trade mark). Then, the package type UV LED is subjected to application of an electric current of 1.0 A to emit UV rays with about 100 W/cm$^2$. In addition, the thickness of the spacer made of Teflon (trade mark) is adjusted so that the junction temperature (Tj) may be 100° C.

The junction temperature is determined by using a thermal resistance determination system AT-205 available from UASA Electronics Co., Ltd.

Each of the curable resin compositions obtained from Examples 1-6 and Comparative Example 1-2 is filled into the concave portion of the package type UV LED and allowed to stand at room temperature so that it is solidified. Then, the curable resin composition is warmed to 150° C. and maintained at 150° C. for 1 hour to carry out drying.

The sealed package type UV LED is subjected to application of an electric current of 1.0 A and the light is on/off continuously. The luminous intensity is determined continuously by using an integrating sphere (available from Labsphere, Model No. 3P-CPS-020SL, inner diameter: φ2 inches).

To determine luminous intensity, a UV integral light counter UIT-150 and a light collector for a UV integral light counter UVD-S365 available from Ushio Denki Co., Ltd. are used. Since an LED tends to undergo degradation of luminous intensity as the lapse of lighting time, determination of UV resistance of a sealant (curable resin composition) is carried out by lighting on/off a non-sealed package type UV LED continuously together with a sealed package type UV LED and comparing the luminous intensity of the former with that of the latter over 5000 hours.

In addition, as described hereinafter, determination of UV resistance includes determining a luminous intensity (corrected value) after 500 hours, luminous intensity (corrected value) after 1000 hours and a luminous intensity after 5000 hours, and judging a sealant providing a luminous intensity (corrected value) of at least 85% after 500 hours as 'passed'.

Figure 4:
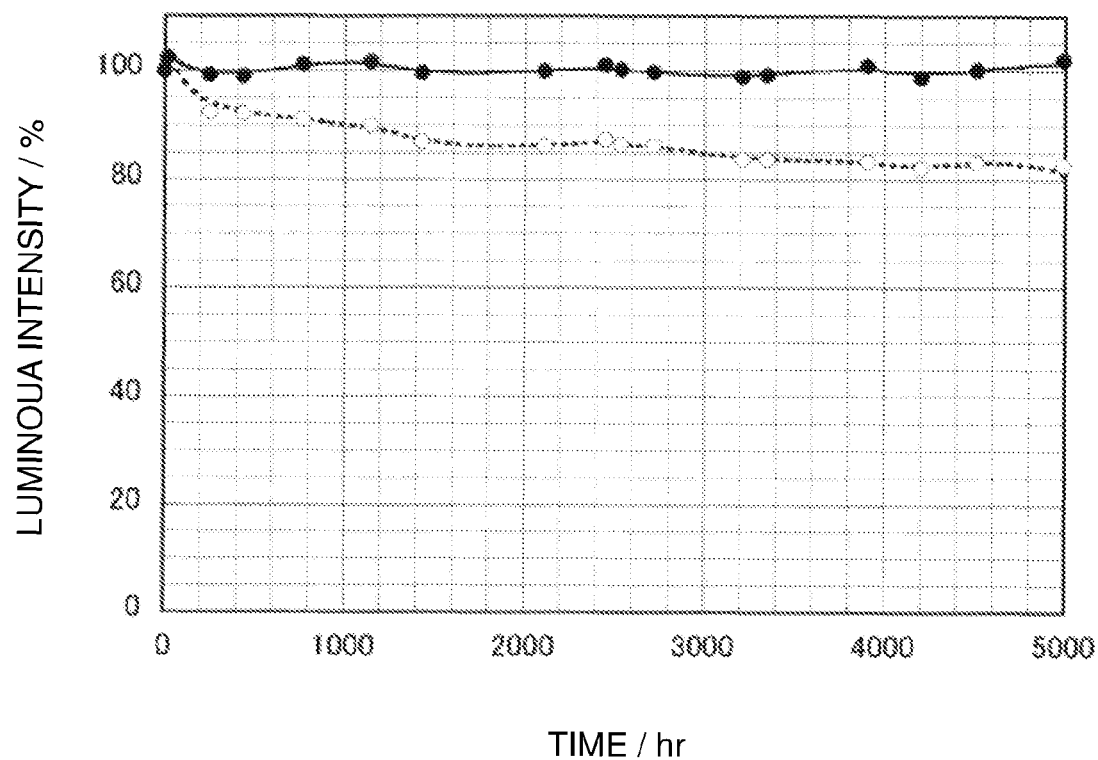
FIG. 4 is a graph illustrating the results of luminous intensity measurement of the curable resin composition according to Example 1.

FIG. 4 is a graph illustrating a change in luminous intensity with time, and illustrates a change in luminous intensity with time of the solidified product of the curable resin composition according to Example 1. In FIG. 4, a graph represented by '○' and a dotted line is one illustrating a change (measured value) in luminous intensity of the solidified product of the curable resin composition according to Example 1 with time and includes a relative value of luminous intensity based on the luminous intensity of an LED right after lighting, taken as 100%.

In addition, in FIG. 4, a graph represented by '●' and a solid line shows a measured value represented by '○' and a dotted line, after its correction (corrected value) considering the luminous intensity of a non-sealed package type UV LED. Particularly, a graph represented by '●' and a solid line (i.e., corrected value) shows a ratio of luminous intensity of the UV rays passing through the solidified product of each sealant (curable resin composition) based on the luminous intensity of a non-sealed package type UV LED, i.e., transmission of the solidified product of each sealant (curable resin composition) to UV rays.

In the solidified product of the solidified product of the curable resin composition according to Example 1, the luminous intensity (corrected value) after 500 hours is evaluated as 95% or more, luminous intensity (corrected value) after 1000 hours is evaluated as 95% or more, and the luminous intensity (corrected value) after 5000 hours is evaluated as 95% or more, as determined from FIG. 4.

After the luminous intensity of an LED sealed with each sealant (curable resin composition) is determined as described above, the results of the luminous intensity (corrected value) after 500 hours, luminous intensity (corrected value) after 1000 hours, and the luminous intensity (corrected value) after 5000 hours are shown in Tables 1 and 2 as UV Resistance (1) (luminous intensity (corrected value) after 500 hours), UV Resistance (2) (luminous intensity (corrected value) after 1000 hours), and UV Resistance (3) (luminous intensity (corrected value) after 5000 hours).

In addition, referring to the evaluation criteria for UV resistance, a luminous intensity (corrected value) after at least 500 hours of 85% or more is judged as 'passed'. However, the evaluation criteria for UV resistance is variable according to the options required for an LED, 87.5% or more being preferred, 90% or more being more preferred.

In addition, the evaluation criteria for UV resistance may further include a luminous intensity (corrected value) after 1000 hours (i.e., UV transmission after 1000 hours). In this case, a luminous intensity (corrected value) after 1000 hours of 85% or more is preferred, 87.5% or more being more preferred, 90% or more being even more preferred.

Further, the evaluation criteria for UV resistance may further include a luminous intensity (corrected value) after 5000 hours (i.e., UV transmission after 5000 hours). In this case, a luminous intensity (corrected value) after 5000 hours of 80% or more is preferred, 85% or more being more preferred, 90% or more being even more preferred.

After the evaluation of UV resistance, no cracking, peeling and coloration are observed in all of the solidified products of the curable resin compositions (sealants) according to Examples 1-6.

TABLE 1

|  |  | Ex. 1 | Ex. 2 | Ex. 3 | Ex. 4 | Ex. 5 | Ex. 6 |
|---|---|---|---|---|---|---|---|
| Content (wt %) | Alkoxy oligomer | 40.0 | 25.0 | 50.0 | 80.0 | 50.0 | 50.0 |
|  | Silicone resin | 60.0 | 75.0 | 50.0 | 20.0 | 50.0 | 50.0 |
|  | Total | 100.0 | 100.0 | 100.0 | 100.0 | 100.0 | 100.0 |
| Shrinkage during curing (decrease in weight before and after curing) |  | 3.2 wt % | 2.4 wt % | 3.8 wt % | 7.5 wt % | 4.0 wt % | 3.9 wt % |
| Remelting after curing |  | No | No | No | No | No | No |
| $Tmin_{300-350}$ |  | 90.6% | 90.2% | 91.5% | 92.0% | 91.5% | 91.2% |
| UV resistance (1) |  | 90% or more | 90% or more | 90% or more | 90% or more | 90% or more | 90% or more |
| UV resistance (2) |  | 90% or more | 90% or more | 90% or more | 90% or more | 90% or more | 90% or more |
| UV resistance (3) |  | 85% or more | 85% or more | 85% or more | 85% or more | 85% or more | 85% or more |

TABLE 2

|  |  | Comp. Ex. 1 | Comp. Ex. 2 |
|---|---|---|---|
| Content (wt %) | Alkoxy oligomer | 90.0 | 15.0 |
|  | Silicone resin | 10.0 | 85.0 |
|  | Total | 100.0 | 100.0 |
| Shrinkage during curing (decrease in weight before and after curing) |  | 11.5 wt % | 1.6 wt % |
| Remelting after curing |  | No | Yes |
| $Tmin_{300-350}$ |  | 91.8% | 89.5% |
| UV resistance (1) |  | 90% or more | 90% or more |
| UV resistance (2) |  | 90% or more | 90% or more |
| UV resistance (3) |  | 85% or more | 85% or more |

As shown in Tables 1 and 2, each of the curable resin compositions according to Examples 1-6 includes 20-85 wt % of a specific alkoxy oligomer present in a liquid state at room temperature and 15-80 wt % of a specific silicone resin present in a solid state at room temperature.

Thus, it can be seen that each curable resin composition shows a shrinkage during curing of 10 wt % or less even when used for sealing a UV LED to which high power is applied, and thus inhibits shrinking during curing adequately. In addition, each of the curable resin compositions has a '$Tmin_{300-350}$' of 85% or more, and shows a 'luminous intensity (corrected value) after 500 hours' (i.e. UV resistance (1)) and a 'luminous intensity (corrected value) after 1000 hours' (i.e. UV resistance (2)) of 90% or more and a 'luminous intensity (corrected value) after 5000 hours' (i.e. UV resistance (1)) of 85% or more. As a result, it can be seen that each of the curable resin compositions according to Examples 1-6 has excellent transparency in the UV region, UV resistance and heat resistance, when used as a sealant.

The sealant (curable resin composition) according to Comparative Example 1 includes a silicone resin in a small proportion of 10.0 wt %, and thus shows a high shrinkage during curing of 11.5%, suggesting that it is difficult to inhibit shrinking during curing.

In addition, the sealant (curable resin composition) according to Comparative Example 2 includes an alkoxy oligomer in a small proportion of 15 wt % and a silicone resin in a relatively high proportion as compared to the alkoxy oligomer, and thus still has thermoplastic property. Thus, it can be seen that the sealant is remolten due to the heat emission of a UV LED.

While the exemplary embodiments have been shown and described, it will be understood by those skilled in the art that various changes in form and details may be made thereto without departing from the scope of this disclosure as defined by the appended claims.

For example, although the above described embodiments include use of a curable resin composition for sealing a UV LED, use of the curable resin composition is not limited thereto but may include use as a sealant material for a light emitting device for use in the other semiconductor light emitting devices (optical semiconductor devices) such as a laser diode, light detectors, electro-optical displays, organic semiconductors, organic light emitting diodes, electro-luminescence displays, organic solar cell devices, light devices, or the like, and as a material for an optical element, such as a lens, prism, rod, diffraction grid, or the like.

Therefore, the above-described embodiments are for illustrative purposes only and are non-limiting. In addition, it is intended that the scope of the present disclosure includes all embodiments falling within the spirit and scope of the appended claims.

INDUSTRIAL APPLICABILITY

According to the present disclosure, it is possible to provide a curable resin composition that has significantly higher transparency in the UV region, UV resistance and heat resistance as compared to the conventional curable resin compositions, does not cause cracking, peeling or coloration even when used as sealant for a UV LED to which high power is applied or as material for an optical element, and is capable of inhibiting shrinking during curing. It is also possible to provide an optical element and optical semiconductor device including the cured product of the curable resin composition.

DESCRIPTION OF MAIN ELEMENTS

100, 200: UV LED
101: substrate
102a, 202a: cathode pattern
102b, 202b: anode pattern
103, 203: LED die
103a, 203a: exit surface
104, 204a, 204b: bonding wire

The invention claimed is:

1. A curable resin composition comprising 20-85 wt % of an alkoxy oligomer present as a liquid at room temperature and 15-80 wt % of a silicone resin present as a solid at room temperature,
   wherein the alkoxy oligomer has an organopolysiloxane structure and has:
   (a) a repeating unit represented by Formula 2 below in combination with at least one repeating unit selected from the group consisting of a repeating unit represented by Formula 5 below, when a is 1, and a repeating unit represented by Formula 6 below, and/or
   (b) a repeating unit represented by Formula 3 below in combination with a repeating unit represented by Formula 5 below, when a is 2, and
   90-100 mol % of the repeating units represented by Formulas 2, 3, 5, and 6 are present based on 100 mol % of total siloxane units forming the alkoxy oligomer:

$$(R^4R^5SiO_{2/2}) \quad (2),$$

where each of $R^4$ and $R^5$ independently represents the same or a different organic group, $$(R^6SiO_{3/2}) \quad (3),$$

where $R^6$ is an organic group, $$(R^7_a(OR^8)_{3-a}SiO_{1/2}) \quad (5),$$

where a is 0, 1 or 2, each of $R^7$ and $R^8$ independently represents the same or a different organic group, and when two or more $R^7$s or $R^8$s are present, each $R^7$ or $R^8$ may be the same or different, and $$(R^9_b(OR^{10})_{2-b}SiO_{2/2}) \quad (6),$$

where b is 0 or 1, and each of $R^9$ and $R^{19}$ independently represents the same or a different organic group.

2. The curable resin composition according to claim 1, further comprising 0.1-20 parts by weight of phosphoric acid as curing catalyst based on 100 parts by weight of a combined weight of the alkoxy oligomer and the silicone resin.

3. The curable resin composition according to claim 1, wherein the alkoxy oligomer comprises alkoxy groups in an amount of 10-30 wt %.

4. The curable resin composition according to claim 1, wherein the solidified product obtained by curing the curable resin composition has a shrinkage of 10 wt % or less during curing.

5. The curable resin composition according to claim 1, wherein the solidified product obtained by curing the curable resin composition shows a UV transmission of 85% or more, when UV light is irradiated to the solidified product at a luminous intensity of 100 W/cm² for 500 hours.

6. The curable resin composition according to claim 1, wherein the solidified product obtained by curing the curable resin composition shows a UV transmission of 85% or more, when UV light is irradiated to the solidified product at a luminous intensity of 100 W/cm² for 1000 hours.

7. The curable resin composition according to claim 1, wherein the solidified product obtained by curing the curable resin composition shows a UV transmission of 80% or more, when UV light is irradiated to the solidified product at a luminous intensity of 100 W/cm² for 5000 hours.

8. The curable resin composition according to claim 5, wherein the UV light has a light emission peak wavelength of 365 nm.

9. An optical element comprising the cured product of the curable resin composition as defined in claim 1.

10. An optical semiconductor device having the optical element as defined in claim 9.

11. An optical semiconductor device having an optical semiconductor element sealed with the curable resin composition as defined in claim 1.

12. The optical semiconductor device according to claim 11, wherein the optical semiconductor element emits light in the UV region.

* * * * *